(12) United States Patent
Kang

(10) Patent No.: US 6,791,888 B2
(45) Date of Patent: Sep. 14, 2004

(54) SEMICONDUCTOR MEMORY DEVICE HAVING PREAMBLE FUNCTION

(75) Inventor: Kyung-woo Kang, Suwon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/329,826

(22) Filed: Dec. 27, 2002

(65) Prior Publication Data

US 2003/0218916 A1 Nov. 27, 2003

(30) Foreign Application Priority Data

May 25, 2002 (KR) .................................. 2002-0029110

(51) Int. Cl.[7] .................................................. G11C 7/00
(52) U.S. Cl. .................. 365/193; 365/233; 365/189.05
(58) Field of Search ............................... 365/193, 233, 365/189.05, 189.11

(56) References Cited

U.S. PATENT DOCUMENTS 6,215,710 B1 * 4/2001 Han et al. .................. 365/233
6,288,971 B1 * 9/2001 Kim ............................ 365/233
6,407,962 B1 * 6/2002 Ka .............................. 365/233
6,603,686 B2 * 8/2003 Yoo et al. ................... 365/193

* cited by examiner

Primary Examiner—Huan Hoang
(74) Attorney, Agent, or Firm—Harness, Dickey & Pierce, P.L.C.

(57) ABSTRACT

A semiconductor memory device includes a data controller for generating a data signal in response to data generated at an internal circuit of the semiconductor memory device when a latency signal, which sets the latency of the semiconductor memory device, is activated. The device includes an output driver for generating a data strobe signal in response to the data signal, a preamble controller for outputting a preamble control signal in response to a read command input to the semiconductor memory device, and a preamble unit for preambling the data strobe signal by changing an output signal of the output driver from a logic high level to a logic low level, when the preamble control signal is activated. Data output from the semiconductor memory device has a satisfactory preamble section.

41 Claims, 9 Drawing Sheets

SEMICONDUCTOR MEMORY DEVICE HAVING PREAMBLE FUNCTION

This application claims the priority of Korean Patent Application No. 2002-29110, filed May 25, 2002, the entire contents of which are hereby incorporated herein by reference.

BACKGROUND OF THE INVENTION

1. Field of the Invention

The present invention generally relates to a semiconductor memory device, and more particularly, to a semiconductor memory device having a preamble function.

2. Description of the Related Art

Data output from a semiconductor memory device having a preamble function, such as dual data rate synchronous dynamic random access memory (DDR SDRAM), is output after the preamble section ends.

FIG. 1 is a timing diagram of a conventional semiconductor memory device having a preamble function. Referring to FIG. 1, when a read command (READ) is in synchronization with an external clock signal (ECLK) and an input to a semiconductor memory device (notshown), a latency control signal (Latencyds) is in synchronization with an internal clock signal (DLL CLK). Moreover, the latency control signal (Latencyds) is activated under such conditions. During the activation of the latency control signal (Latencyds), an output data strobe signal (DQS) output from the semiconductor memory device is changed from a logic high level to a logic low level. As a result, output data (DQ) has a preamble section tp. The preamble section tp is maintained for one cycle of the internal clock signal (DLL CLK), and the output data strobe signal (DQS) is activated and output external to the semiconductor memory device when a latency signal (Latency) is activated.

As described above, according to the conventional semiconductor memory device, the preamble section tp is maintained only for one cycle of the internal clock signal (DLL CLK). Therefore, it is possible to maintain the preamble section tp when the operational frequency of the semiconductor memory device is low. However, if the operational frequency of the semiconductor memory device is high, e.g., the operational frequency is more than 300 MHz, the duty cycle of the internal clock signal (DLL CLK) becomes very short. In this case, a starting point of the preamble section tp may be delayed or the preamble section tp may not be present, which prevents the semiconductor memory device from stably outputting data.

In conclusion, the higher the operational frequency of a semiconductor memory device, the more difficult it is to maintain a preamble section tp.

SUMMARY OF THE INVENTION

An exemplary embodiment of the present invention provides a semiconductor memory device in which a preamble section is sufficiently secured.

An exemplary embodiment of the present invention provides a semiconductor memory device having a preamble function, including an output driver for generating a data strobe signal and, outputting the same external to the semiconductor memory device. The embodiment also includes a preamble unit for preambling the data strobe signal by changing an output signal of the output driver from a high impedance status to a logic low level. This is achieved in synchronization with an activation of a read command input to the semiconductor memory device.

In addition, an exemplary embodiment of the present invention provides a semiconductor memory device having a preamble function, including a data controller for generating a data signal in response to data generated at an internal circuit of the semiconductor memory device when a latency signal, which sets the latency of the semiconductor memory device, is activated. The semiconductor memory device may also include an output driver for generating a data strobe signal in response to the data signal, a preamble controller for outputting a preamble control signal in response to a read command input to the semiconductor memory device, and a preamble unit for preambling the data strobe signal by changing an output signal of the output driver from a high impedance status to a logic low level, when the preamble control signal is activated.

Furthermore, an exemplary embodiment of the present invention provides a semiconductor memory device having a preamble function, including an output driver having a pull-up unit for generating a data strobe signal in response to a data signal and a control signal generated at an internal circuit of the semiconductor memory device. The pull-up unit is activated to output the data strobe signal to a logic high level when the data signal is at a logic low level. Furthermore, the pull-down unit is activated to output the data strobe signal to a logic low signal when the control signal is at a logic high level. The semiconductor memory device may further include a logic unit for outputting the control signal to a logic high level and sending the same to the pull-down unit when at least one of the data signal and the preamble control signal generated in response to a read command input to the semiconductor memory device is at a logic high level. According to an exemplary embodiment of the present invention, an output of the output driver is maintained at a high impedance status during a stand-by state, the pull-down unit is activated when the preamble control signal becomes active, and then, the output of the output driver is changed from the high impedance status to a logic low level; therefore, the data strobe signal output from the semiconductor memory device is preambled.

Still further, an exemplary embodiment of the present invention provides a semiconductor memory device having a preamble function. The semiconductor memory device includes a data controller for outputting a data signal in response to data generated at an internal circuit of the semiconductor memory device. The foregoing occurs when a latency signal, which sets the latency of the semiconductor memory device, is activated. The semiconductor device further includes an output driver for generating an output data strobe signal, a pull-up unit being activated to output the data strobe signal to a logic high level when the data signal output from the data controller is at a logic low level, and a pull-down unit being activated to output the data strobe signal to a logic low level when the input control signal is at a logic high level. Furthermore, the device includes a preamble controller for outputting a preamble control signal in response to a read command input to the semiconductor memory device, and a logic unit for outputting an output signal to a logic high and inputting the same to the pull-down unit when at least one of the preamble control signal and the data signal is at a logic high level. The logic unit is for preambling the data strobe signal by changing the data strobe signal to a logic low level when the preamble control signal is activated.

An exemplary embodiment of the present invention provides a semiconductor memory device having a preamble function. The semiconductor device includes an output driver for outputting a data strobe signal to the outside of the semiconductor memory device, and a preamble unit for receiving a read command in synchronization with a clock of an external clock signal input to the semiconductor memory device and outputting a control signal. The output driver also may output a control signal to change the data strobe signal from a high impedance status to a logic low level in response to the control signal in synchronization with the clock of the external clock signal.

Furthermore, an exemplary embodiment of the present invention provides a semiconductor memory device having a preamble function. The device includes a data controller for generating a data signal in response to data generated at an internal circuit of the semiconductor memory device when a latency signal, which sets the latency of the semiconductor memory device, is activated. Furthermore, the semiconductor device includes an output driver for outputting a data strobe signal in response to the data signal, a preamble controller for receiving a read command in synchronization with a clock of an external clock signal input to the semiconductor memory device and outputting a preamble control signal in synchronization with a clock of the external clock signal to which the read command is input, and a preamble unit for changing the data strobe signal from a high impedance status to a logic low level when the preamble control signal is activated.

In addition, an exemplary embodiment of the present invention provides a semiconductor memory device having a preamble function. The semiconductor device includes an output driver for generating a data strobe signal in response to a data signal and a control signal generated at an internal circuit of the semiconductor memory device. The output driver includes a pull-up unit being activated to output the data strobe signal to a logic high level when the data signal is at a logic low level, and a pull-down unit being activated to output the data strobe signal to a logic low level when the control signal is at a logic high level. Furthermore, a logic unit is provided for outputting the control signal to a logic high level and sending the same to the pull-down unit, when a read command is input to the semiconductor memory device in synchronization with a clock of an external clock signal input to the semiconductor memory device and at least one of a preamble control signal. The preamble control signal is generated in synchronization with a clock of the external clock signal to which the read command is input, and the data signal is at a logic high level, wherein an output of the output driver is maintained at a logic high level during a stand-by state, and the pull-down unit is activated to change the output of the output driver from the high impedance status to a logic low level when the preamble control signal is activated, thereby preambling the data strobe signal.

Furthermore, an exemplary embodiment of the present invention provides a semiconductor memory device having a preamble function. The semiconductor device includes a data controller for outputting a data signal in response to data generated at an internal circuit of the semiconductor memory device when a latency signal, which sets the latency of the semiconductor memory device, is activated. Moreover, the device includes an output driver for generating an output data strobe signal, the output driver having a pull-up unit for generating a data strobe signal being output to a logic high level when the data signal output from the data controller is at a logic low level, and a pull-down unit being activated to output the data strobe signal to a logic low level when the control signal is at a logic high level. The output driver further includes a preamble controller for receiving a read command in synchronization with a clock of an external clock signal input to the semiconductor memory device and outputting a preamble control signal in synchronization with a clock of the external clock signal to which the read command is input, and a logic unit for outputting an output signal to a logic high level and sending the same to the pull-down unit when at least one of the preamble control signals and the data signal is at a logic high level. The logic unit preambles the data strobe signal by changing the data strobe signal to a logic low level.

According to the embodiments of the present invention, it may be possible to sufficiently secure a preamble section in a data strobe signal output from a semiconductor memory device.

Further scope of applicability of the present invention will become apparent from the detailed description given hereinafter. However, it should be understood that the detailed description and specific examples, while indicating exemplary embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
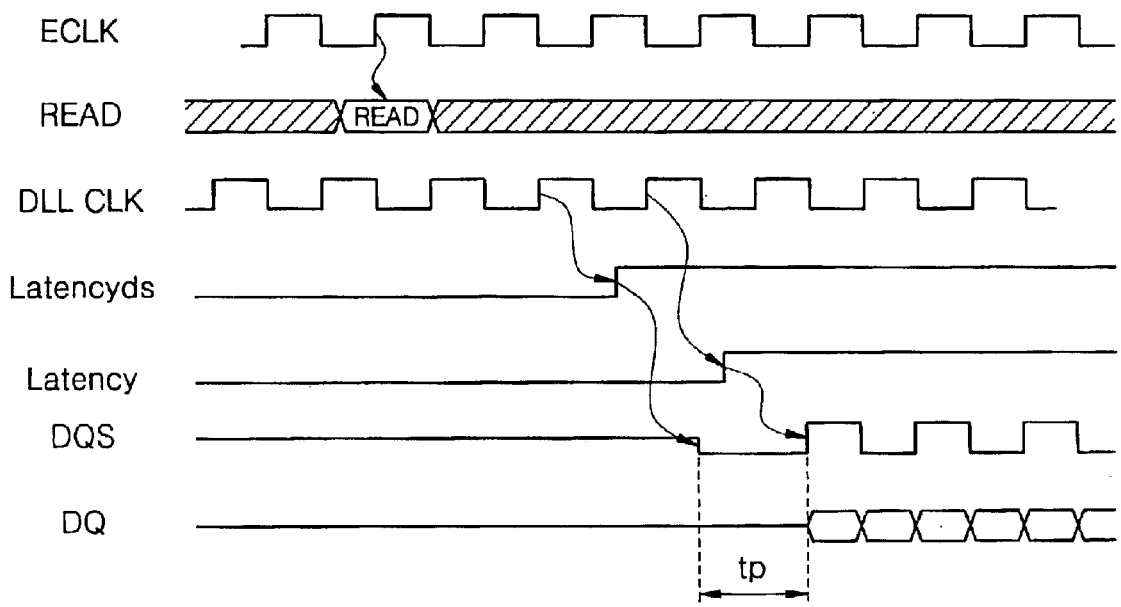
FIG. 1 is a timing diagram of a conventional semiconductor memory device having a preamble function.
Figure 2:
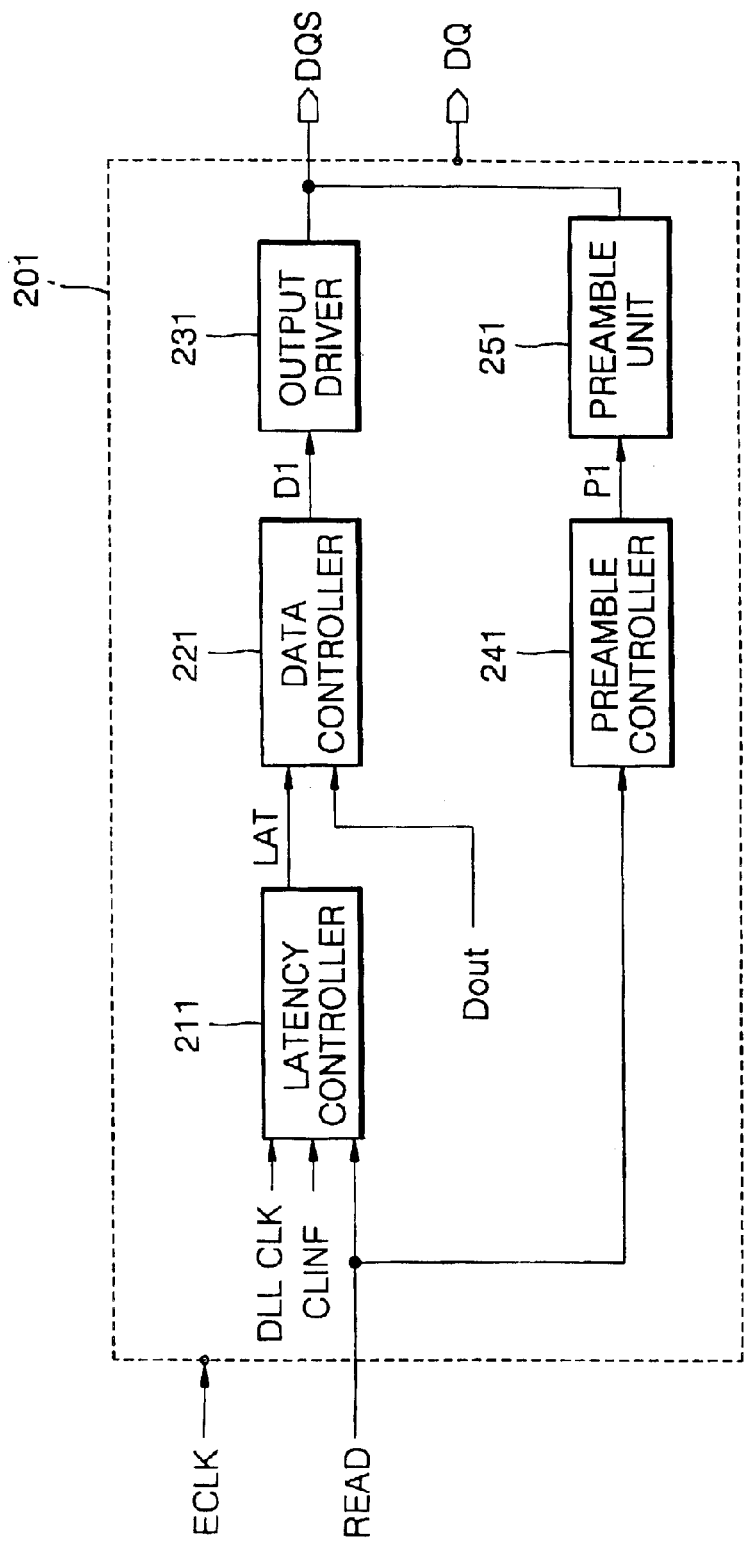
FIG. 2 is a block diagram of a first exemplary embodiment of a semiconductor memory device having a preamble function according to the present invention.

Exemplary embodiments of the present invention will now be described more fully with reference to the accompanying drawings. The present invention may, however, be embodied in many different forms and should not be construed as being limited to the exemplary embodiments set forth herein. Rather, the exemplary embodiments are merely FIG. 2 is block diagram of a semiconductor memory device 201 having a preamble function, according to a first exemplary embodiment of the present invention. Referring to FIG. 2, the semiconductor memory device 201 includes a latency controller 211, a data controller 221, an output driver 231, a preamble controller 241, and a preamble unit 251.

The latency controller 211 receives an internal clock signal (DLL CLK), a column address strobe (CAS) latency information signal (CLINF), and a read command (READ), and generates a latency signal (LAT). The read command (READ) is input to the latency controller 211 in synchronization with an external clock signal (ECLK). The CAS latency information signal (CLINF) is input to the latency controller 211 in synchronization with the internal clock signal (DLL CLK). The CAS latency information signal (CLINF) sets the length of the latency of the semiconductor memory device 201 to be, for example, CL (CAS Latency) 2, CL3, and CL4.

The data controller 221 receives the latency signal (LAT), and internal data Dout output from memory cells (not shown) of the semiconductor memory device 201. When the internal data Dout is input to the data controller 221 and the latency signal (LAT) is activated, the data controller 221 generates an output control signal D1. The output control signal D1 may be a clock signal similar to the external clock signal (ECLK), and the data controller 221 may be a multiplexer.

The output driver 231 buffers the output control signal D1 output from the data controller 221 and outputs the same to the outside of the semiconductor memory device 201. The output driver 231 inverts the output control signal D1 and outputs it as an output data strobe signal DQS output from the semiconductor memory device 201. If the output control signal D1 is deactivated, the output driver 231 maintains the output data strobe signal DQS at a high impedance status.

The preamble controller 241 outputs a preamble control signal P1 in response to the read command (READ). That is, the preamble controller 241 activates the preamble control signal P1 when the read command (READ) is activated. More specifically, the read command (READ) is input to the semiconductor memory device 201 in synchronization with a clock of the external clock signal (ECLK) applied to the semiconductor memory device 201, and the preamble control signal P1 is output from the preamble controller 241 in synchronization with a clock of the external clock signal (ECLK).

When the preamble control signal P1 is activated, the preamble unit 251 is activated to change the output data strobe signal DQS from a high impedance status to a logic low level, thereby preambling the output data strobe signal DQS. The output data DQ is output to the outside of the semiconductor memory device 201 at an instant in time a preamble section, which corresponds to the preamble section tp, of the output data strobe signal DQS ends.

According to a first exemplary embodiment of the present invention, an output terminal of the output driver 231 is changed from a high impedance status to a logic low level in synchronization with the activation of the read command (READ), which is input to the semiconductor memory device 201. Accordingly, the output data strobe signal DQS is preambled. That is, the read command (READ) is input to the semiconductor memory device 201 in synchronization with a clock of the external clock signal (ECLK) applied to the semiconductor memory device 201. As a result, the preamble control signal P1 changes the output data strobe signal DQS from a logic high level to a logic low level in synchronization with a clock of the external clock signal (ECLK) in which the read command (READ) is input, thereby preambling the output data strobe signal DQS.

Accordingly, since the output data strobe signal DQS is preambled prior to the activation of the latency signal (LAT), a preamble section of the output data strobe signal DQS may be secured sufficiently. Thus, the output data DQ may be stably output from the semiconductor memory device 201.

Figure 3:
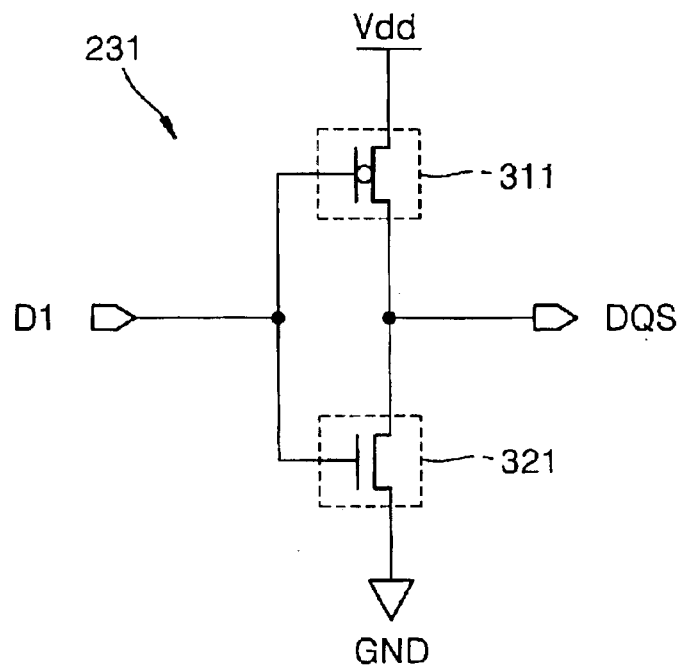
FIG. 3 is a circuit diagram of an output driver shown in FIG. 2.

FIG. 3 is a circuit diagram of the output driver 231 of FIG. 2. Referring to FIG. 3, the output driver 231 includes a pull-up unit 311 and a pull-down unit 321.

The pull-up unit 311 is activated and outputs an output data strobe signal DQS to a logic high level when an output control signal D1 is at a logic low level. When the output control signal D1 is at logic high level, the pull-up unit 311 is deactivated and thus does not affect the output data strobe signal DQS. The pull-up unit 311 includes a PMOS transistor having a gate to which the output control signal D1 is input. Although a PMOS transistor is illustrated as being used with this exemplary embodiment of the present invention, other types of transistors may also be used. For example, an MOS, NMOS, or the like, transistor may also be used if it is configured properly with the pull-up unit 311.

The pull-down unit 321 is activated and outputs the output data strobe signal DQS to a logic low level when the output control signal D1 is at a logic high level but is deactivated and does not affect the output data strobe signal DQS when the output control signal D1 is at a logic low level. The pull-down unit 321 includes an NMOS transistor having a gate to which the output control signal D1 is input. Although an NMOS transistor is illustrated as being used with this exemplary embodiment of the present invention, other types of transistors may also be used. For example, an MOS, PMOS, or the like, transistor may also be used if it is configured properly with the pull-down unit 321.

Figure 4:
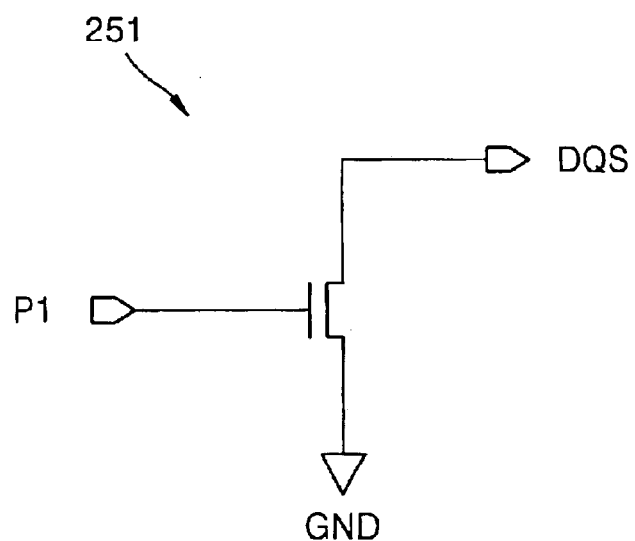
FIG. 4 is a circuit diagram of a preamble unit shown in FIG. 2.

FIG. 4 is a circuit diagram of the preamble unit 251 of FIG. 2. Referring to FIG. 4, the preamble unit 251 includes a pull-down transistor such as an NMOS transistor having a gate to which a preamble control signal P1 is input. The preamble unit 251 is activated when the preamble control signal P1 is at a logic high level and pulls down an output data strobe signal DQS to a logic low level, and is deactivated and does not affect the output data strobe signal DQS when the preamble control signal P1 is at a logic low level.

Figure 5:
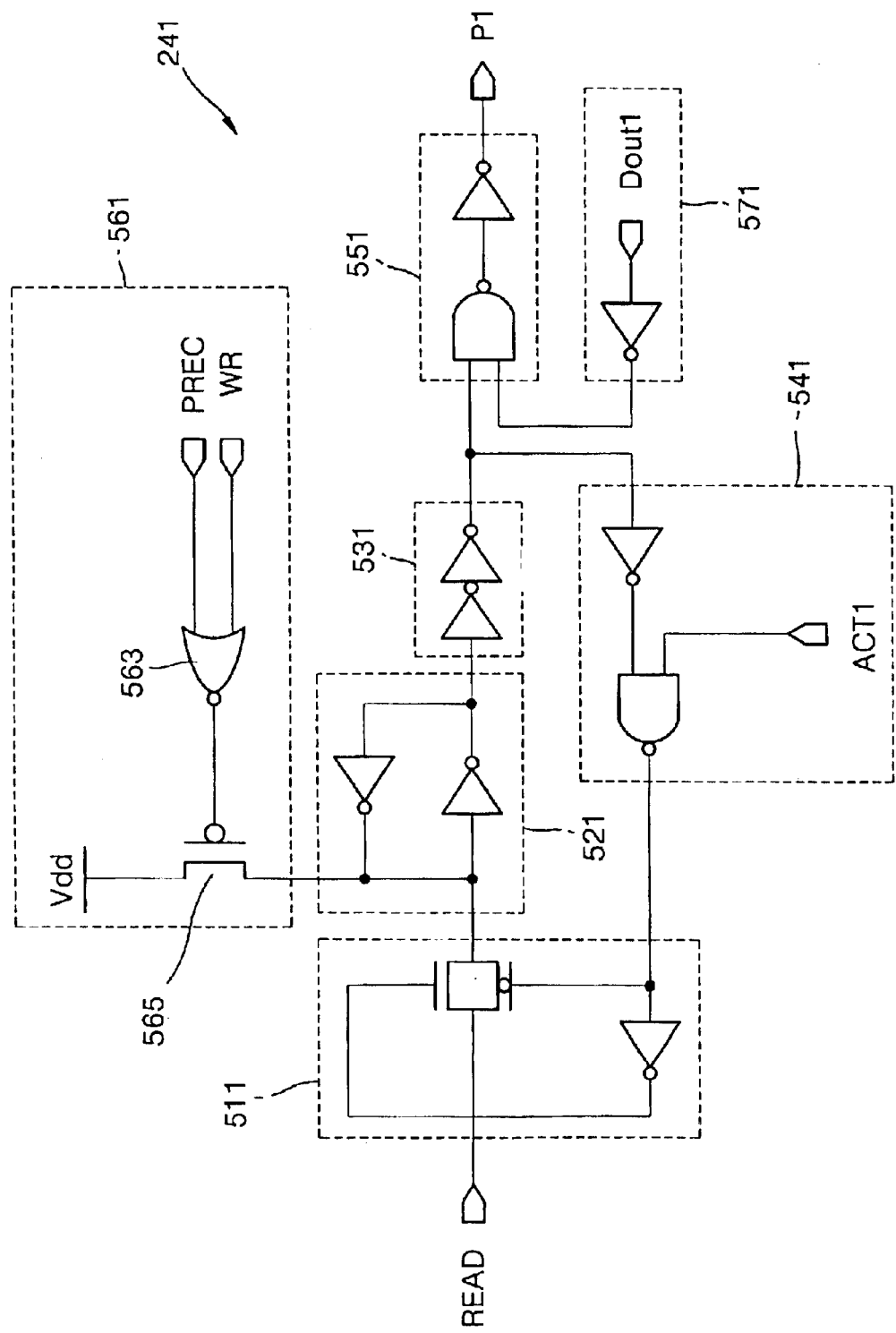
FIG. 5 is a circuit diagram of a preamble controller shown in FIG. 2.

FIG. 5 is a circuit diagram of the preamble controller 241 of FIG. 2. Referring to FIG. 5, the preamble controller 241 includes a transmission gate 511, a latch unit 521, a delayer 531, a transmission gate controller 541, an output controller 551, and first and second reset units 561 and 571.

The transmission gate 511 receives a read command (READ) and transmits it to the latch unit 521. The transmission gate 511 is activated and transmits the read command (READ) to the latch unit 521 when a signal output from the transmission gate controller 541 is at a logic low level, and is deactivated and does not transmit the read command (READ) to the latch unit 521 when a signal output from the transmission gate controller 541 is at a logic high level.

The latch unit 521 latches the read command (READ) transmitted from the transmission gate 511.

The delayer 531 delays a signal output from the latch unit 521 for a predetermined time. The predetermined time is adjustable according to the size of the delayer 531. The preamble controller 241 may not include the delayer 531, if desired.

The transmission gate controller 541 receives a signal output from the delayer 531 and an external control signal ACT1. The transmission gate controller 541 outputs a signal to a logic high level and activates the transmission gate 511, only when the signal output from the delayer 531 is at a logic low level and the external control signal ACT1 is at a logic high level.

The output controller 551 activates a preamble control signal P1 to a logic high level if both the signal output from the delayer 531 and a signal output from the second reset unit 571 are at logic high levels.

The first reset unit 561 includes a NOR gate 563 and a PMOS transistor 565. The first reset unit 561 outputs a power source voltage Vdd and resets the preamble control signal P1 to a logic low level when one of a precharge signal PREC and a write signal WR is activated to a logic high level.

The second reset unit 571 resets the preamble control signal P1 to a logic low level when a data output control signal Dout 1 is activated to a logic high level.

Hereinafter, the overall operations of the preamble controller 241 will be described with reference to FIG. 5.

During the latency of the semiconductor memory device 201, the read command (READ) is at a logic high level, and thus, the preamble control signal P1 is maintained at a logic low level. However, when the read command (READ) and the external control signal ACT1 are activated to a logic low level and a high level, respectively, the transmission gate 511 is activated to transmit the read command (READ) to the latch unit 521. At this time, the data output control signal Dout1 is at a logic low level, and therefore, the output controller 551 activates the preamble control signal P1 to a logic high level. In this case, if at least one of the precharge signal PREC and the write signal WR is activated to a logic high level, a signal output from the first reset unit 561 is activated to a logic high level and the preamble control signal P1 is deactivated to a logic low level. Also, when the data output control signal Dout1 is activated to a logic high level, a signal output from the second reset unit 571 is deactivated to a logic low level and the preamble control signal P1 is reset to a logic low level.

Figure 6:
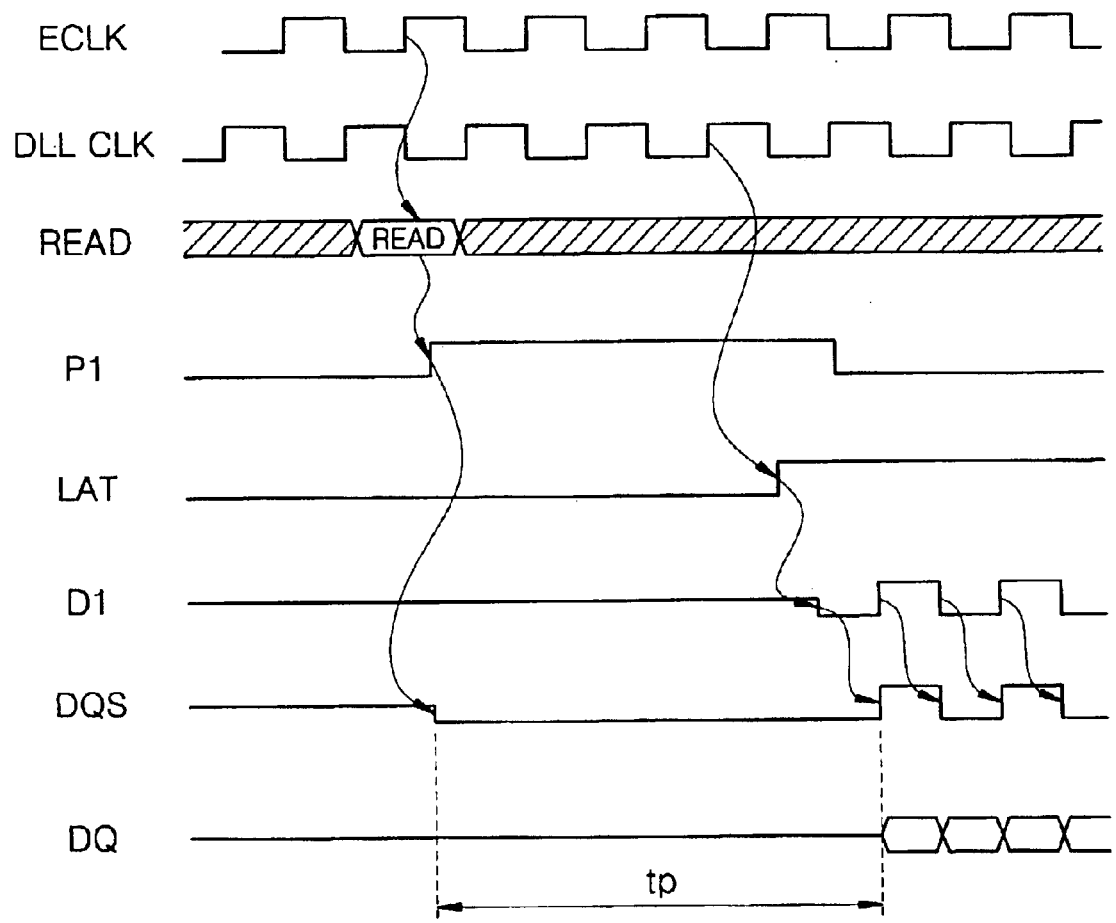
FIG. 6 is a timing diagram of a semiconductor memory device in which the preamble unit of FIG. 2 has a large pull-down transistor.

FIG. 6 is a timing diagram of the semiconductor memory device 201 of FIG. 2 having the preamble unit 251 that has a large pull-down transistor. As shown in FIG. 6, in case that the preamble unit 251 has a large pull-down transistor, an output data strobe signal DQS is rapidly changed from a high impedance status to a logic low level at the moment a read command (READ) is activated. That is, a preamble section tp of the output data strobe signal DQS, which is output from the semiconductor memory device 201, is sufficiently present. Therefore, the semiconductor memory device 201 may stably output the output data DQ even if the operational frequency of the semiconductor memory device 201 becomes high.

Figure 7:
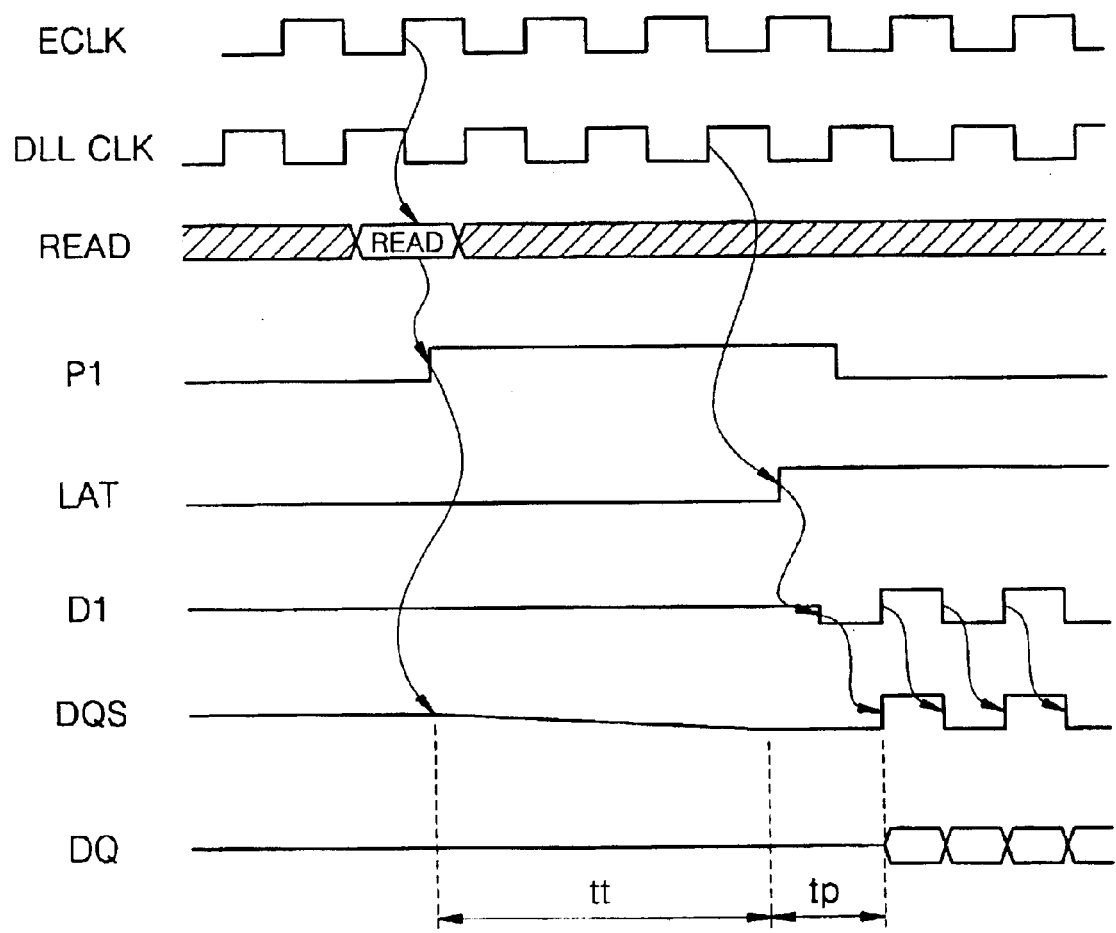
FIG. 7 is a timing diagram of a semiconductor memory device in which the preamble unit of FIG. 2 has a small pull-down transistor.

FIG. 7 is a timing diagram of the semiconductor memory device 201 having the preamble unit 251 of FIG. 2 that has a small pull-down transistor. As shown in FIG. 7, if the preamble unit 251 has a small pull-down transistor, an output data strobe signal DQS is gradually changed from a high impedance status to a logic low level at the moment of activation of a read command (READ). In this case, a preamble section tp of the output data strobe signal DQS, which is output from the semiconductor memory device 201, is shorter than that of the semiconductor memory device 201 of FIG. 2 having the preamble unit 251 that has a large pull-down transistor. Nevertheless, the preamble section tp is secured, and thus, the output data DQ may be stably output from the semiconductor memory device 201 without an error. This is achieved independently of the operational frequency of the semiconductor memory device 201.

Figure 8:
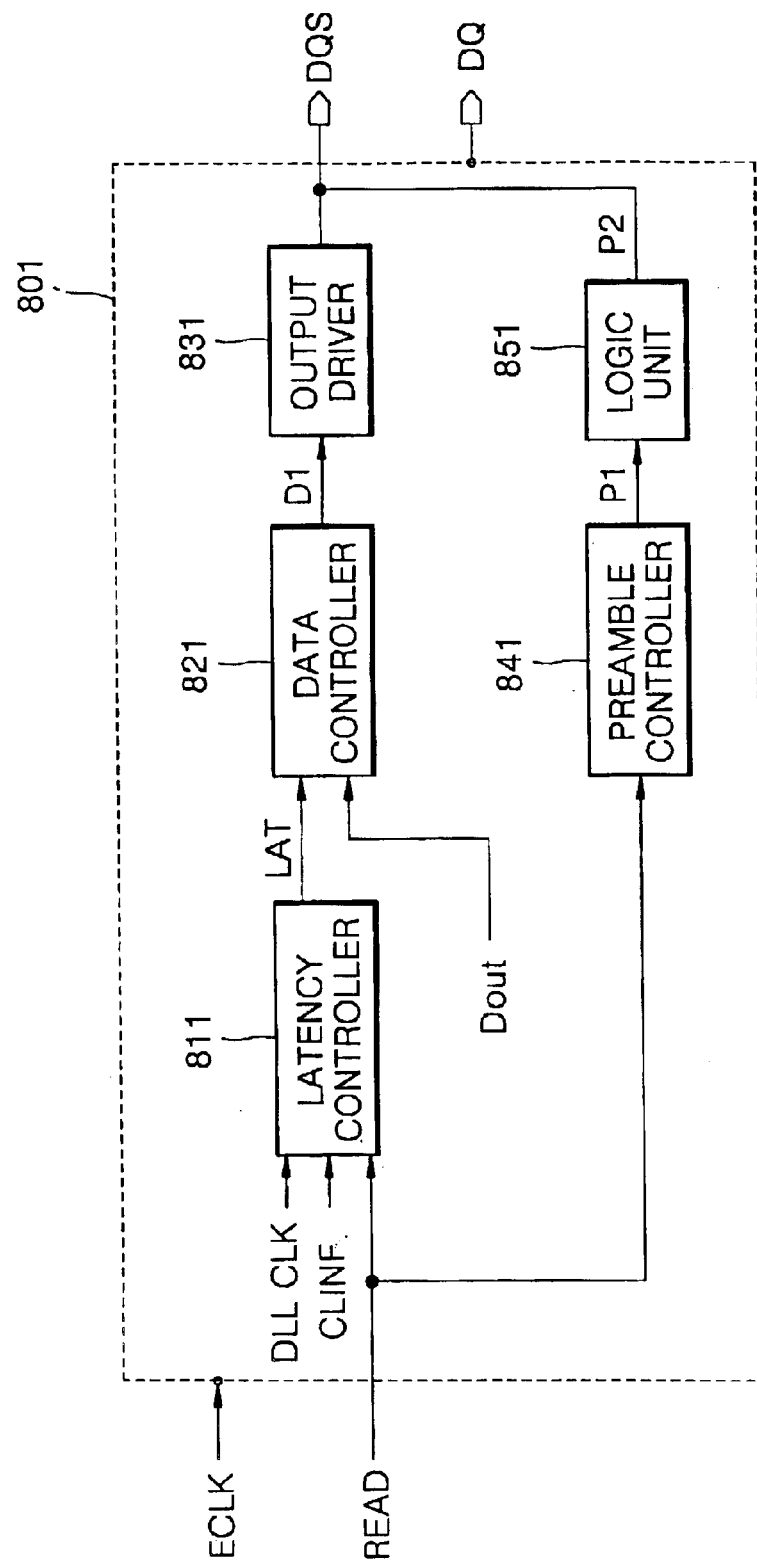
FIG. 8 is a block diagram of a second exemplary embodiment of a semiconductor memory device having a preamble function according to the present invention.

FIG. 8 is a block diagram of a semiconductor memory device 801 according to a second exemplary embodiment of the present invention. Referring to FIG. 8, the semiconductor memory device 801 includes a latency controller 811, a data controller 821, an output driver 831, a preamble controller 841, and a logic unit 851.

The latency controller 811 receives an internal clock signal (DLL CLK), a column address strobe (CAS) latency information signal (CLINF), and a read command (READ), and generates a latency signal (LAT). The read command (READ) is input to the latency controller 811 in synchronization with an external clock signal (ECLK). The CAS latency information signal (CLINF) is input to the latency controller 811 in synchronization with the internal clock signal (DLL CLK). The CAS latency information signal (CLINF) sets the length of the latency of the semiconductor memory device 201 to be, for example, CL2, CL3, and CL4.

The data controller 821 receives the latency signal (LAT), and internal data Dout output from memory cells (not shown) of the semiconductor memory device 801, and generates an output control signal D1. When the internal data Dout is input to the data controller 821 and the latency signal (LAT) is activated, the data controller 821 activates the output control signal D1. The output control signal D1 may be a clock signal similar to the external clock signal (ECLK), and the data controller 821 may be a multiplexer.

The preamble controller 841 generates a preamble control signal P1 in response to the read command (READ). That is, the preamble controller 841 activates the preamble control signal P1 when the read command (READ) is activated. In other words, the read command (READ) is input to the preamble controller 841 in synchronization with the external clock signal (ECLK) applied to the semiconductor memory device 801, and the preamble control signal P1 is generated by the preamble controller 841 in synchronization with a clock of the external clock signal (ECLK) to which the read command (READ) is input.

The logic unit 851 receives the preamble control signal P1 and the output control signal D1. The logic unit 851 changes the output data strobe signal DQS from a high impedance status to a logic low level when the preamble control signal P1 is activated, thereby preambling the output data strobe signal DQS output from the semiconductor memory device 801. The output data DQ output from the semiconductor memory device 801 is output to the outside of the semiconductor memory device 801 at an instant of time a preamble section tp of the output data strobe signal DQS ends (shown in FIG. 11). The logic unit 851 outputs a signal output from the data controller 821 when the preamble control signal P1 is at a logic low level.

The output driver 831 buffers the output control signal D1 output from the data controller 821 and outputs the same external of the semiconductor memory device 801. The output driver 831 inverts the output control signal D1 and outputs it as an output data strobe signal DQS output from the semiconductor memory device 801. If the output control signal D1 is deactivated, the output driver 831 maintains the output data strobe signal DQS to have a high impedance status.

According to the second exemplary embodiment of the present invention, the output data strobe signal DQS output from the semiconductor memory device 801 is preambled at the moment the read command (READ) is activated. That is, the output data strobe signal DQS is preambled prior to the activation of the latency signal (LAT), thereby securing a preamble section of the output data strobe signal DQS. Thus, the output data DQ can be output stably from the semiconductor memory device 801 even if the operational frequency of the semiconductor memory device 801 is high.

Figure 9:
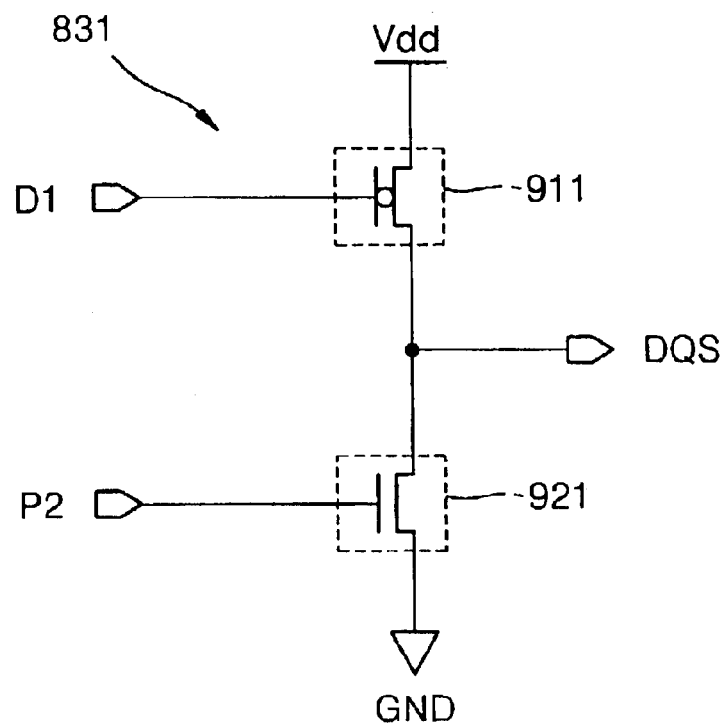
FIG. 9 is a circuit diagram of an output driver shown in FIG. 8.

FIG. 9 is a circuit diagram of the output driver 831 of FIG. 8. Referring to FIG. 9, the output driver 831 includes a pull-up unit 911 and a pull-down unit 921.

The pull-up unit 911 is activated to output an output data strobe signal DQS to a logic high level when an output control signal D1 is at a logic low level, and is inactivated and does not affect the output data strobe signal DQS when the data strobe signal D1 is at a logic high level. The pull-up unit 911 includes a PMOS transistor having a gate to which the output control signal D1 is input. Although a PMOS transistor is illustrated as being used with this exemplary embodiment of the present invention, other types of transistors may also be used. For example, an MOS, NMOS, or the like, transistor may also be used if it is configured properly with the pull-up unit 911.

The pull-down unit 921 is activated to output an output data strobe signal DQS to a logic low level when a signal P2 output from the logic unit 851 is at a logic high level, and is inactivated and does not affect the output data strobe signal DQS when the signal P2 output from the logic unit 851 is at a logic low level. The pull-down unit 921 includes an NMOS transistor having a gate to which the signal P2 output from the logic unit 851 is input. Although an NMOS transistor is illustrated as being used with this exemplary embodiment of the present invention, other types of transistors may also be used. For example, an MOS, PMOS, or the like, transistor may also be used if it is configured properly with the pull-up unit 911.

Figure 10:
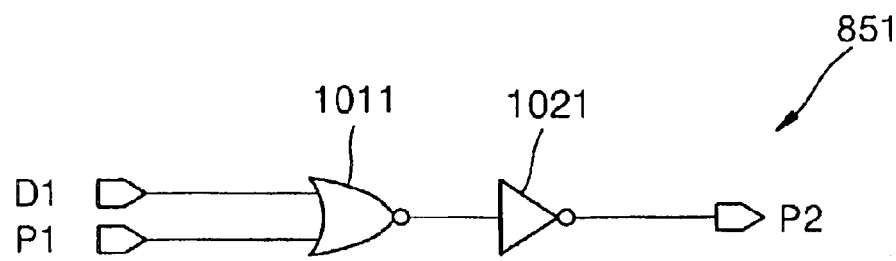
FIG. 10 is a circuit diagram of a logic unit shown in FIG. 8.

FIG. 10 is a circuit diagram of the logic unit 851 of FIG. 8. Referring to FIG. 10, the logic unit 851 includes a NOR gate 1011 that receives an output control signal D1 and a preamble control signal P1, and an inverter 1021 that inverts an output of the NOR gate 1011. The logic unit 851 outputs an output signal P2 to a high level when at least one of the output control signal D1 and the preamble control signal P1 is at a logic high level, and outputs the output signal P2 to a low level when both the output control signal D1 and the preamble control signal P1 are at logic low levels. The NOR gate is used by way of example only. In particular, one of ordinary skill in the art is well aware that substitute logic circuits may be used to mimic the functionality of the NOR gate. For example, an OR gate may be used in conjunction with an inverter at the output thereof to produce the same logic results as a NOR gate.

Figure 11:
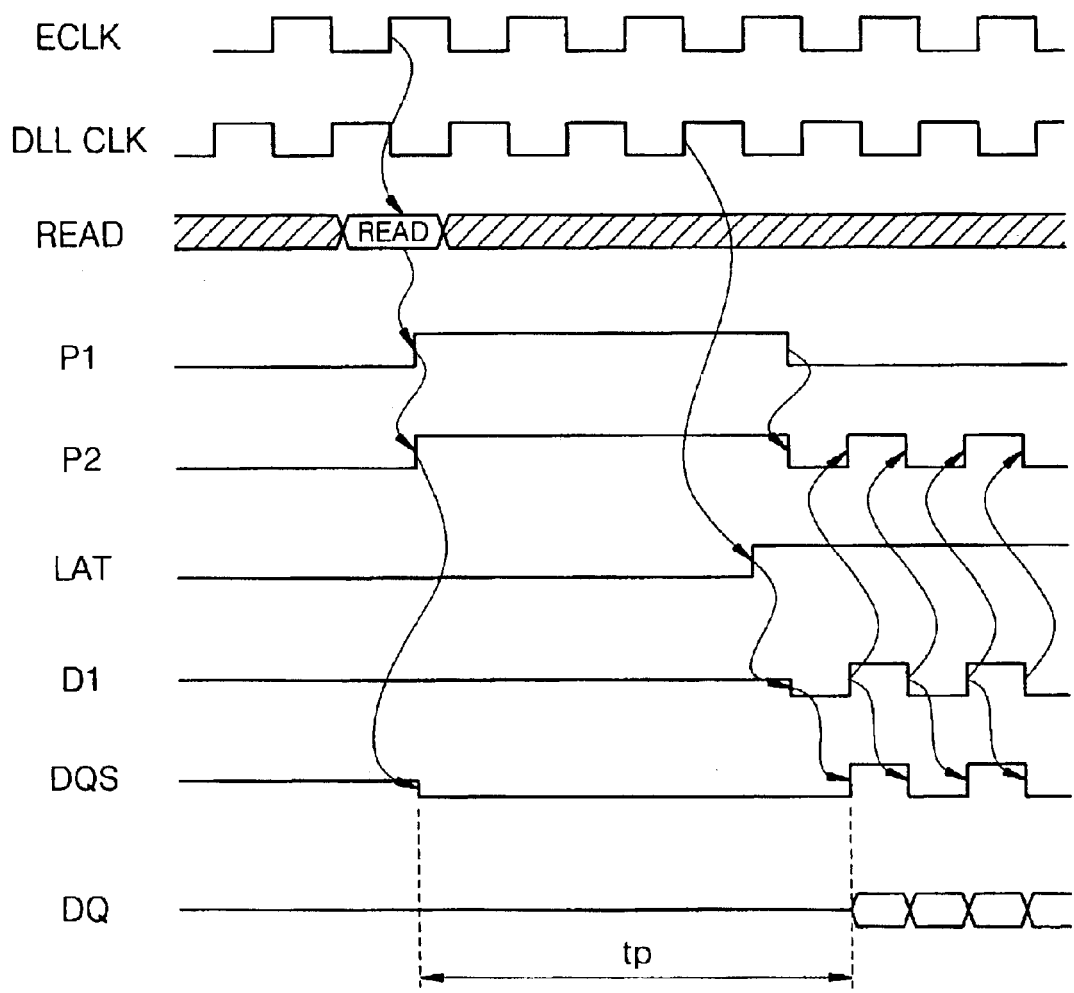
FIG. 11 is a timing diagram of the semiconductor memory device of FIG. 8.

FIG. 11 is a timing diagram of the semiconductor memory device of FIG. 8. As shown in FIG. 11, an output data strobe signal DQS is rapidly changed from a high impedance status to a logic low level at the moment of activation of a read command (READ). As a result, a preamble section tp of the output data strobe signal DQS can be sufficiently secured, and thus, output data DQ is output stably from the semiconductor memory device 801 even if the operational frequency of the semiconductor memory device 801 becomes high.

The structure and operations of the preamble controller 841 are the same as those of the preamble controller 241 shown in FIG. 5, and therefore, descriptions thereof will be omitted.

The semiconductor memory devices 201 and 801 according to exemplary embodiments of the present invention may be any semiconductor memory devices having preamble functions.

As described above, according to exemplary embodiment of the present invention, it is possible to sufficiently secure preamble sections tp of output data strobe signals DQS output from the semiconductor memory devices 201 and 801. Accordingly, output signals can be output stably from the semiconductor memory devices 201 and 801 irrespective of the operational frequencies of the semiconductor memory devices 201 and 801.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device having a preamble function, comprising:
    an output driver for generating a data strobe signal; and
    a preamble unit for preambling the data strobe signal by changing an output signal of the output driver from a high impedance status to a logic low level in substantial synchronization with an activation of a read command input to the semiconductor memory device.

2. The semiconductor memory device of claim 1, wherein the data strobe signal is output external of the semiconductor memory device.

3. A semiconductor memory device having a preamble function, comprising:
    a data controller for generating a data signal in response to data generated at an internal circuit of the semiconductor memory device;
    an output driver for generating a data strobe signal in response to the data signal;
    a preamble controller for outputting a preamble control signal in response to a read command input to the semiconductor memory device; and
    a preamble unit for preambling the data strobe signal by changing an output signal of the output driver from a high impedance status to a logic low level, the preambling being effectuated when the preamble control signal is activated.

4. The semiconductor memory device of claim 3, wherein the data controller is a multiplexer.

5. The semiconductor memory device of claim 3, further comprising a latency controller for receiving the read command and generating the latency signal.

6. The semiconductor memory device of claim 5, wherein the read command is substantially synchronized with an internal clock signal of the semiconductor device.

7. The semiconductor memory device of claim 3, wherein the preamble unit comprises pull-down transistor for pulling down an output of the output driver when the preamble control signal is activated.

8. The semiconductor memory device of claim 7, wherein in accordance with a type of pull-down transistor used, the data strobe signal is one of rapidly changed to a logic low level thereby a preamble section of the data strobe signal becomes longer and gradually changed to a logic low level thereby a preamble section of the data strobe signal becomes shorter.

9. The semiconductor memory device of claim 3 wherein the data signal is generated in response to an activation of a latency signal.

10. The semiconductor memory device of claim 9, wherein the latency signal set a latency of the semiconductor memory device.

11. A semiconductor memory device having a preamble function, comprising:
- an output driver including a pull-up unit for generating a data strobe signal in response to a data signal and a control signal generated at an internal circuit of the semiconductor memory device, the pull-up unit being activated to output the data strobe signal to a logic high level when the data signal is at a logic low level, and a pull-down unit being activated to output the data strobe signal to a logic low level when the control signal is at a logic high level; and
- a logic unit for outputting the control signal at a logic high level and sending the same to the pull-down unit when at least one of the data signal and a preamble control signal is at a logic high level,
- wherein an output of the output driver is maintained at a high impedance status during a stand-by state, the pull-down unit is activated when the preamble control signal becomes active, and the output of the output driver is changed from the high impedance status to a logic low level at a time the pull-down unit is activated, thereby preambling the data strobe signal output from the semiconductor memory device.

12. The semiconductor memory device of claim 11, wherein the data signal is input to the pull-up unit when a latency signal, which is generated in response to a read command input to the semiconductor memory device, is activated.

13. The semiconductor memory device of claim 11, wherein the preamble control signal is generated in response to a read command input to the semiconductor memory device.

14. A semiconductor memory device having a preamble function, comprising:
- a data controller for outputting a data signal in response to data generated at an internal circuit of the semiconductor memory device when a latency signal is activated;
- an output driver for generating an output data strobe signal, and the output driver including a pull-up unit for outputting the data strobe signal at a logic high level when the data signal output from the data controller is at a logic low level, and a pull-down unit for outputting the data strobe signal at a logic low level when a control signal is input at a logic high level;
- a preamble controller for outputting a preamble control signal in response to a read command input to the semiconductor memory device; and
- a logic unit for outputting the control signal, the control signal being provided to the pull-down unit at a logic high level when at least one of the preamble control signal and the data signal is at a logic high level, the logic unit for preambling the data strobe signal by changing the data strobe signal to a logic low level when the preamble control signal is activated.

15. The semiconductor memory device of claim 14, wherein an output of the output driver is maintained at a high impedance status during a stand-by state.

16. The semiconductor memory device of claim 14, wherein the data controller is a multiplexer.

17. The semiconductor memory device of claim 14, further comprising a latency controller for receiving the read command being substantially synchronized with an internal clock signal of the semiconductor memory device, and for generating the latency signal.

18. The semiconductor memory device of claim 14, wherein the logic unit is an NOR circuit.

19. A semiconductor memory device having a preamble function, comprising:
- an output driver for outputting a data strobe signal; and
- a preamble unit for receiving a read command substantially synchronized with a clocking signal of an external clock signal input to the semiconductor memory device and for outputting a control signal to change the data strobe signal from a high impedance status to a logic low level.

20. The semiconductor memory device of claim 19, wherein the data strobe signal is output external of the semiconductor memory device.

21. A semiconductor memory device having a preamble function, comprising:
- a data controller for generating a data signal in response to data generated at an internal circuit of the semiconductor memory device;
- an output driver for outputting a data strobe signal in response to the data signal;
- a preamble controller for receiving a read command substantially synchronized with a clock of an external clock signal input to the semiconductor memory device and for outputting a preamble control signal substantially synchronized with a clock of the external clock signal to which the read command is input; and
- a preamble unit for changing the data strobe signal from a high impedance status to a logic low level when the preamble control signal is activated.

22. The semiconductor memory device of claim 21, wherein the data controller is a multiplexer.

23. The semiconductor memory device of claim 21, further comprising a latency controller for receiving the read command substantially synchronized with an internal clock signal of the semiconductor memory device, and for generating a latency signal that sets a latency of the semiconductor memory device.

24. The semiconductor memory device of claim 21, wherein the preamble unit comprises pull-down transistor for pulling down an output of the output driver when the preamble control signal is activated.

25. The semiconductor memory device of claim 24, wherein in accordance with a type of pull-down transistor used, the data strobe signal is one of rapidly changed to a logic low level thereby a preamble section of the data strobe signal becomes longer and gradually changed to a logic low level thereby a preamble section of the data strobe signal becomes shorter.

26. The semiconductor memory device of claim 21 wherein the data signal is generated in response to an activation of a latency signal.

27. The semiconductor memory device of claim 26, wherein the latency signal set a latency of the semiconductor memory device.

28. A semiconductor memory device having a preamble function, comprising:
- an output driver for generating a data strobe signal in response to a data signal and a control signal generated at an internal circuit of the semiconductor memory device, the output driver including a pull-up unit being activated to output the data strobe signal to a logic high level when the data signal is at a logic low level, and a pull-down unit being activated to output the data strobe signal to a logic low level when the control signal is at a logic high level; and a logic unit for outputting the control signal to a logic high level and sending the same to the pull-down unit, the logic unit outputs the control signal when a read command is input to the semiconductor memory device being in substantial synchronization with a clock of an external clock unit being input to the semiconductor memory device and when at least one of a preamble control signal the data signal is at a logic high level, wherein an output of the output driver is maintained at a high impedance status during a stand-by state, and the pull-down unit is activated to change the output of the output driver from the high impedance status to a logic low level when the preamble control signal is activated, thereby preambling the data strobe signal.

29. The semiconductor memory device of claim 28, wherein the data signal is input to the pull-up unit when a latency signal, which is generated in response to the read command, is activated.

30. The semiconductor memory device of claim 28, wherein the preamble control signal is generated in substantial synchronization with a clock of the external clock unit.

31. A semiconductor memory device having a preamble function, comprising:

a data controller for outputting a data signal in response to data generated at an internal circuit of the semiconductor memory device when a latency signal is activated;

an output driver for generating an output data strobe signal, the output driver including a pull-up unit for generating a data strobe signal being output to a logic high level when the data signal output from the data controller is at a logic low level, and a pull-down unit being activated to output the data strobe signal to a logic low level when a control signal is at a logic high level;

a preamble controller for receiving a read command substantially synchronized with a clock of an external clock signal input to the semiconductor memory device and for outputting a preamble control signal substantially synchronized with a clock of the external clock signal to which the read command is input; and a logic unit for outputting the control signal at a logic high level and sending the same to the pull-down unit when at least one of the preamble control signals and the data signal is at a logic high level, the logic unit for preambling the data strobe signal by changing the data strobe signal to a logic low level.

32. The semiconductor memory device of claim 31, wherein an output of the output driver is maintained at a high impedance status during a stand-by state.

33. The semiconductor memory device of claim 31, wherein the data controller is a multiplexer.

34. The semiconductor memory device of claim 31, further comprising a latency controller for receiving the read command substantially synchronized with an internal clock signal of the semiconductor memory device, and for generating the latency signal.

35. The semiconductor memory device of claim 31, wherein the logic unit is an NOR circuit.

36. A semiconductor device, comprising:

a controller for receiving a read command;

a preamble controller for activating a preamble control signal in response to the controller receiving the read command, the preamble control signal for activating a preamble unit; and the preamble unit for preambling a data strobe signal by changing an output signal of an output driver from a high impedance status to a logic low level in substantial synchronization with an activation of the read command input to the controller.

37. The semiconductor device of claim 36, wherein the controller is a latency controller.

38. A semiconductor device, comprising:

a controller for receiving a read command;

a preamble controller for activating a preamble control signal in response to the controller receiving the read command, the preamble control signal for activating a preamble section; and an output driver for providing a data strobe signal, the data strobe signal being set to a logic high level once the preamble controller generates the preamble control signal, the logic high level of the data strobe signal marking a commencement of the preamble control signal.

39. A semiconductor device, comprising:

an interface for receiving an external clock;

a preamble controller for activating a preamble control signal in substantial synchronization with the external clock, the preamble control signal for activating a preamble unit; and the preamble unit for preambling a data strobe signal by changing an output signal of an output driver from a high impedance status to a logic low level in substantial synchronization with an activation of a read command input to the semiconductor device.

40. A semiconductor device, comprising:

an output driver for providing a data strobe signal upon receiving a latency signal;

a preamble controller for activating a preamble control signal, the preamble control signal causing the data strobe signal to change a logic level, wherein the change in logic level substantially starts a running of a preamble unit; and a preamble unit for preambling the data strobe signal by changing an output signal of the output driver from a high impedance status to a logic low level in substantial synchronization with an activation of a read command input to the semiconductor memory device.

41. The semiconductor device of claim 40, wherein the preamble controller activates the preamble control signal once the semiconductor device receives a read command.

* * * * *